(12) United States Patent
Kuo

(10) Patent No.: US 11,638,355 B2
(45) Date of Patent: Apr. 25, 2023

(54) ELECTRONIC DEVICE

(71) Applicant: ABILITY ENTERPRISE CO., LTD., New Taipei (TW)

(72) Inventor: Chien-Tsun Kuo, New Taipei (TW)

(73) Assignee: ABILITY ENTERPRISE CO., LTD., New Taipei (TW)

( * ) Notice: Subject to any disclaimer, the term of this patent is extended or adjusted under 35 U.S.C. 154(b) by 548 days.

(21) Appl. No.: 16/845,645

(22) Filed: Apr. 10, 2020

(65) Prior Publication Data
US 2020/0383213 A1 Dec. 3, 2020

(30) Foreign Application Priority Data
May 27, 2019 (CN) .......................... 201920768912.1

(51) Int. Cl.
*H05K 5/00* (2006.01)
*H05K 5/02* (2006.01)
*B65D 43/22* (2006.01)

(52) U.S. Cl.
CPC ............ *H05K 5/0013* (2013.01); *B65D 43/22* (2013.01); *H05K 5/0004* (2013.01); *H05K 5/0086* (2013.01); *H05K 5/0217* (2013.01); *H05K 5/0221* (2013.01)

(58) Field of Classification Search
CPC .......... H02G 3/08; H02G 3/081; H02G 3/088; H05K 5/00; H05K 5/02; H05K 5/0004; H05K 5/0013; H05K 5/0086; H05K 5/0217; H05K 5/0221; H05K 7/1434; H05K 7/1401; B65D 43/22
USPC ....... 174/50, 520, 559, 17 R, 535, 542, 560; 361/600, 601, 679.01, 679.02; 439/535, 439/536
See application file for complete search history.

(56) References Cited

U.S. PATENT DOCUMENTS

| 4,066,838 A * | 1/1978 | Fujita ..................... H02B 1/044 174/53 |
| 8,014,130 B1 * | 9/2011 | Nguyen ............... H05K 5/0278 361/752 |
| 8,101,874 B2 * | 1/2012 | Yang ..................... H02G 3/088 174/559 |
| 9,380,725 B2 * | 6/2016 | Broccardo ........... H05K 5/0204 |

* cited by examiner

*Primary Examiner* — Angel R Estrada
(74) *Attorney, Agent, or Firm* — Innovation Counsel LLP

(57) ABSTRACT

An electronic device includes an accommodation and an electronic module. The accommodation has an acceptor, a first connector, a second connector and an elastic. The elastic is between the first connector and the second connector. The second connector is on the acceptor. The first connector and the second connector have a bump and a track respectively. The first connector and the second connector are linearly relatively movable with the bump and the track. The electronic module connects to the acceptor. With a pre-designed path of the track, the electronic device allows the electronic module to be easily stored in the accommodation, and be taken out of the accommodation by a simple pressing action.

18 Claims, 6 Drawing Sheets

ELECTRONIC DEVICE

This application claims the benefit of People's Republic of China Application No. 201920768912.1, filed May 27, 2019, the disclosure of which is incorporated by reference herein in its entirety.

TECHNICAL FIELD

The invention relates to an electronic device, and more particularly to an electronic device with an electronic module which can be stored or ejected by pressing.

BACKGROUND

With the development of the industry and the improvement of the quality of life, more and more beauty or maintenance related electronic products have been widely used in daily life. For example, electronic modules such as skin quality detection devices or introduction devices have been found in ordinary homes.

However, due to the precise structures, these electronic modules need to be stored in dedicated protective cases to avoid damage resulting from collision. However, due to inconvenient operation, these protective cases are easily forgotten at home or stored without being taken out with the electronic module. Over time, these protective cases may disappear. Once the protective case is lost, if the user accidentally hits the electronic module, in addition to leaving scars on the appearance of the electronic module, the electronic module is also easily damaged.

SUMMARY

According to one embodiment of the present invention, an electronic device is provided. The electronic device includes an accommodation and an electronic module. The accommodation has an acceptor, a first connector, a second connector and an elastic. The elastic is between the first connector and the second connector. The second connector is on the acceptor. The first connector and the second connector have a bump and a track respectively. The first connector and the second connector are linearly relatively movable with the bump and the track. The electronic module connects to the acceptor.

According to another embodiment of the present invention, an electronic device is provided. The electronic device includes an electronic module, an accommodation and a lock and release mechanism. The accommodation has an acceptor, a first connector and a second connector. The acceptor connects to the electronic module. The first connector and the second connector have a bump and a track couple to each other respectively. The lock and release mechanism connects to the acceptor and positions the acceptor at a locking position or a release position.

In one embodiment, the accommodation further includes a housing, and the acceptor, the first connector, the second connector and the elastic is in the housing.

In one embodiment, the track includes a plurality of paths.

In one embodiment, each of the paths has a locked-segment, and the locked-segment has a first side extending along a first direction and a second side extending along a second direction.

In one embodiment, the second connector has an axis, a first angle is between the first direction and the axis, a second angle is between the second direction and the axis, and the first angle and the second angle are unequal.

In one embodiment, the first side and the second side are on opposite sides of the locked-segment or on the same side of the locked-segment.

In one embodiment, each of the paths has a released-segment, the released-segment includes a third side extending along the first direction and a fourth side extending along the second direction, the second connector has an axis, a third angle is between the third side and the axis, a fourth angle is between the fourth side and the axis, and the third angle and the fourth angle are unequal.

In one embodiment, the third side and the fourth side are on opposite sides of the released-segment.

In one embodiment, each of the paths has a plurality of peaks and a plurality of valleys, and the peaks and the valleys are disposed offset from each other.

In one embodiment, a number of the at least one bump is even, and a number of the paths is an integer multiple of the number of the bump.

In one embodiment, the electronic device further includes an anti-slip portion on an opening end of the housing.

The present invention provides an electronic device that is easy to store and take out. With a pre-designed path of the track, the electronic module can be easily stored in the accommodation, and be taken out of the accommodation by a simple pressing action.

BRIEF DESCRIPTION OF THE DRAWINGS

The above and other objects, features, advantages and embodiments of the present invention will be more apparent and understood with the description of the drawings as follows.

DETAILED DESCRIPTION

In the following description, the spirit of the present invention will be illustrated with the drawings and the detailed descriptions. After understanding the preferred embodiments of the present invention, those skilled in the art may further change and modify the skills disclosed in the present invention, which do not depart from the spirit and scope of the present invention.

Figure 1B:
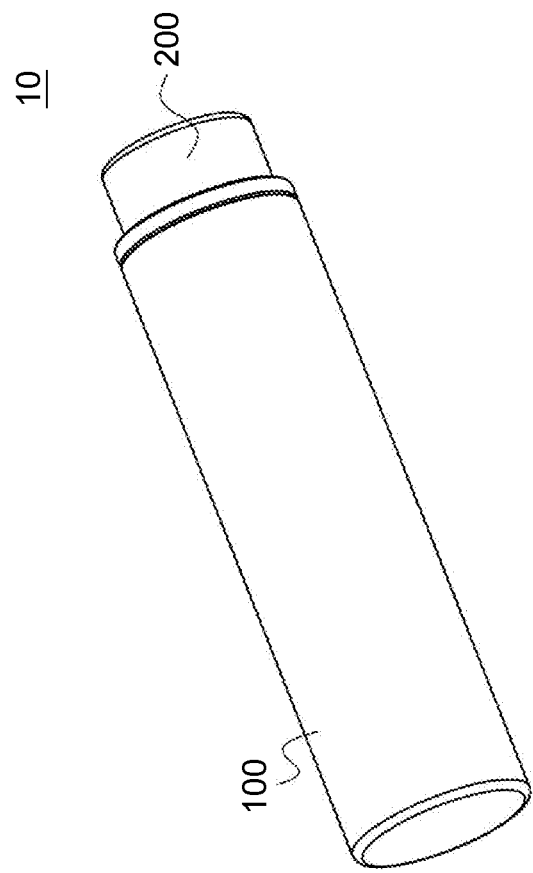
FIG. 1B is a schematic diagram of the electronic device at an extended state according to one embodiment of the present invention.
Figure 1A:
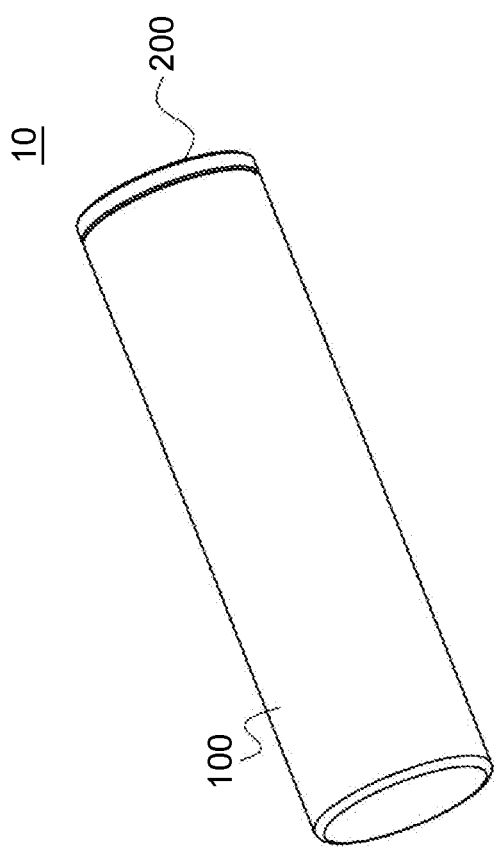
FIG. 1A is a schematic diagram of an electronic device at a storage state according to one embodiment of the present invention.

Referring to FIG. 1A and FIG. 1B, schematic diagrams of an electronic device at a storage state and an extended state according to one embodiment of the present invention are respective shown.

Referring to FIG. 1A and FIG. 1B at the same time, the electronic device 10 includes an accommodation 100 and an electronic module 200. The accommodation 100 may protect the electronic module 200 from being damaged by an external force; the electronic module 200 may be easily taken out of the accommodation 100. Since the electronic module 200 is integrated with the accommodation 100, it may achieve a good balance in portability and operability.

Figure 2:
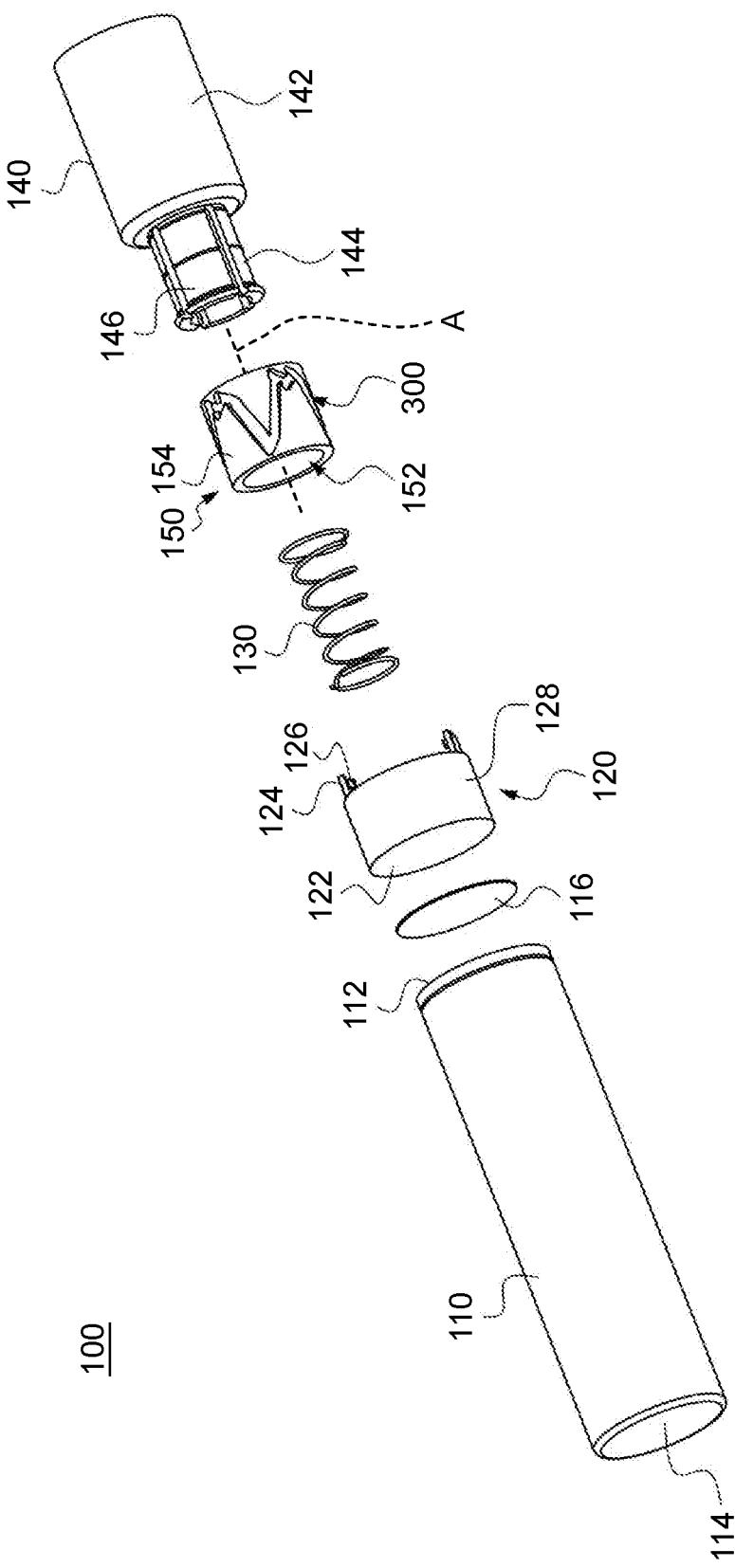
FIG. 2 is an exploded view of the accommodation of the electronic device according to one embodiment of the present invention.

FIG. 2 is an exploded view of the accommodation of the electronic device according to one embodiment of the present invention.

Referring to FIG. 2, the accommodation 100 has a housing 100, a first connector 120, an elastic 130, an acceptor 140 and a second connector 150. The housing 110 has an opening end 112 and a bottom end 114. All of the first connector 120, the elastic 130, the acceptor 140 and the second connector 150 are storage in the housing 110.

The opening end 112 and the bottom end 114 are opposite ends of the housing 110 along an axial direction, respectively. The opening end 112 is an open end, and the bottom end 114 is a closed end.

The accommodation 100 may further include a bonding element 116. The first connector 120 may be fixed on the bottom end 114 of the housing 110 by the bonding element 116. The bonding element 116 may be an adhesive material layer, which may fix the first connector 120 to the bottom end 114 of the housing 110, including but not limited to super glue, double-sided adhesive, and double-sided foamed housing 110.

The first connector 120 includes a first tube 128, a base 122, an extended section 124 and a bump 126. The base 122 is on one end of the first tube 128, the extended section 124 extends along the first tube 128 from the base 122 to the opening end 112, and the bump 126 is on the extended section 124. In one embodiment, the first connector 120 has an even number of extended sections 124 and an even number of bumps 126. In one specific embodiment, the extended section 124 is evenly on the first tube 128; in another embodiment, the first tube 128, the base 122, the extended section 124 and the bump 126 are integrally formed, for example, by plastic injection molding.

The elastic 130 is between the first connector 120 and the second connector 150. Specifically, the elastic 130 is on the first tube 128 of the first connector 120. In one specific embodiment, one end of the elastic 130 is fixed on the base 122 of the first connector 120, and the other end of the elastic 130 abuts against the second connector 150. The elastic 130 may be a spring, for example, a compression spring. After being compressed, the elastic 130 may provide a reactive elastic force in a reverse direction.

The acceptor 140 includes an accommodation portion 142 and a clamping portion 144. The accommodation portion 142 is tube-shaped, the clamping portion 144 protrudes from the accommodation portion 142 to the first connector 120, and the second connector 150 may be sleeved on the clamping portion 144. Specifically, the second connector 150 may be a tube structure having a hollow portion 152, and the clamping portion 144 may have a plurality of hooks 146 with a gap between two adjacent hooks 146. The hook 146 may pass through the hollow portion 152 of the second connector 150 from one end of the second connector 150, and the hook 146 passing through the hollow portion is exposed from the other end of the second connector 150 and hooks the second connector 150, thereby preventing the second connector 150 from being released from the acceptor 140. The elastic 130 is in the hollow portion 152 of the second connector 150 and the hollow area of the clamping portion 144, and abuts against the bottom surface of the accommodation portion 142 when the electronic device is at the storage state.

In one embodiment, the first connector 120 and the second connector 150 respectively have at least one bump 126 and a track 300. The bump 126 and the track 300 may be coupled to each other, and the slide of the bump 126 along the track 300 may allow the first connector 120 and the second connector 150 to rotate relative to each other and linearly move relative to each other in the axial direction of the accommodation 100. Thus, the acceptor 140 may be locked or released by the coupling of the bump 126 and the track 300.

In one specific embodiment, the first connector 120 has the bump 126, the second connector 150 has the track 300 and a second tube 154, the track 300 is on the outer surface of the second tube 154, and the bump 126 and the track 300 may be coupled to each other. The track 300 may be a closed annular track. When the electronic device 10 is at the storage state, the first connector 120, the elastic 130 and the second connector 150 position the acceptor 140 at a locking position or a release position, but the present invention is not limited thereto. In another specific embodiment, the first connector 120 has the track 300, the second connector 150 has the bump 126, and the bump 126 and the track 300 may be coupled to each other.

Figure 3B:
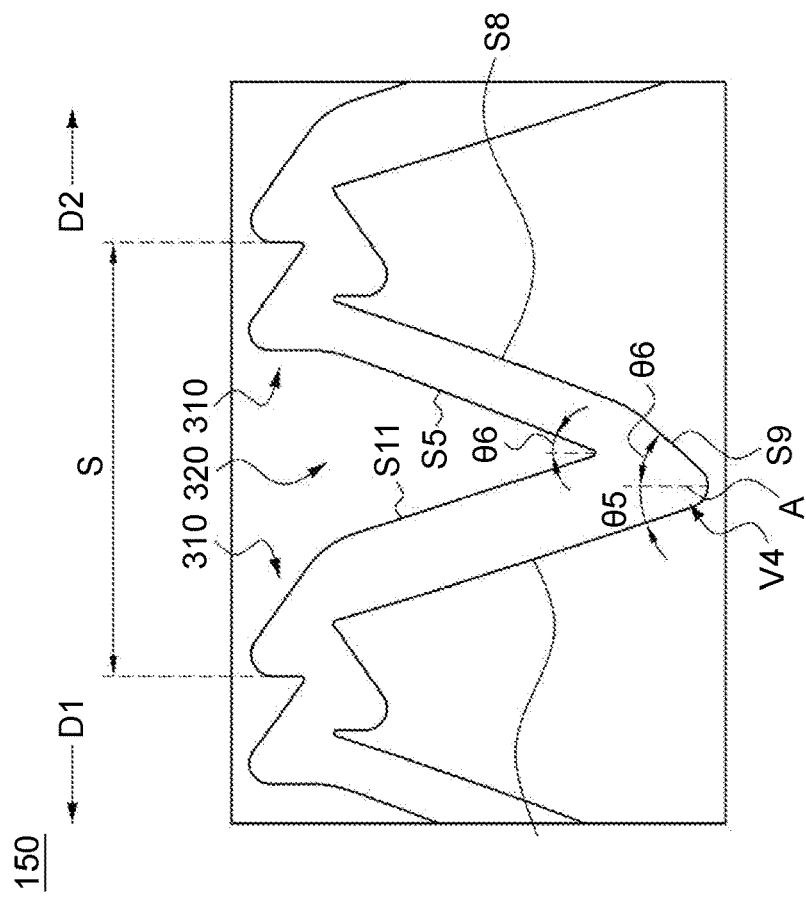
FIG. 3B is a partial enlarged view of the second connector of FIG. 2 in a second view angle.
Figure 3A:
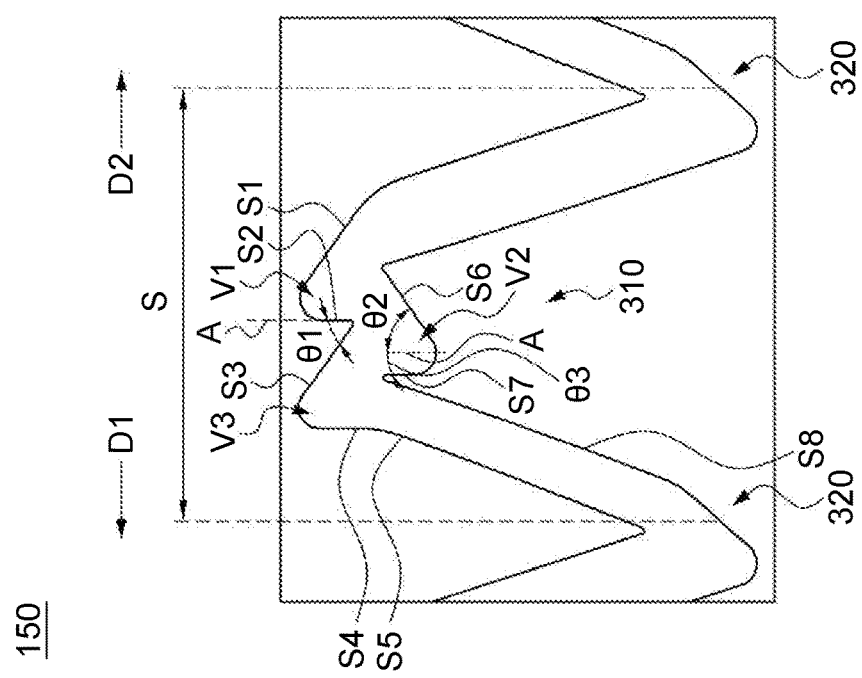
FIG. 3A is a partial enlarged view of the second connector of FIG. 2 in a first view angle.

FIG. 3A is a partial enlarged view of the second connector of FIG. 2 in a first view angle; FIG. 3B is a partial enlarged view of the second connector of FIG. 2 in a second view angle. In the following description, the first connector 120 having a bump 126 and the second connector 150 having a track 300 are exemplified, but the present invention is not limited thereto.

Referring to FIG. 2, FIG. 3A and FIG. 3B at the same time, the track 300 of the second connector 150 includes a plurality of up-and-down paths S. The paths S are continuous and repeatedly on the outer surface of the second connector 150. That is, the track 300 is formed of the paths S periodically repeated in a closed manner. Each path S has a locked-segment 310 and a released-segment 320. Each locked-segment 310 connects to the former and the later released-segments 320, and each released-segment 320 connects to the former and the later locked-segments 310. In one specific embodiment, the track 300 of the second connector 150 includes paths S numbering X, and the first connector 120 includes bumps 126 numbering nX, wherein n and X are positive integers. That is, the number of the paths S of the track 300 is an integer multiple of the number of the bumps 126.

Referring to FIG. 3A, the locked-segment 310 includes a plurality of side walls S1, S2, S3, S4, S5, S6, S7, S8, wherein the side walls S1, S2, S3, S4, S5 are on the side of the track 300 closer to the accommodation portion 142, and the side walls S6, S7, S8 are on the side of the track 300 farther away from the accommodation portion 142. That is, the side walls S1, S2, S3, S4, S5 and the side walls S6, S7, S8 are respectively on opposite sides of the track 300.

A peak V1 is between the side wall S1 and the side wall S2, a valley V2 is between the side wall S6 and the side wall S7, and a peak V3 is between the side wall S3 and the side wall S4. The valley V2 is between the peak V1 and the peak V3, and the valley V2, the peak V1 and the peak V3 are disposed offset from each other. For example, the second connector 150 has an axis A, the valley V2 and the peak V1 do not overlap in the axis A, and the valley V2 and the peak V3 do not overlap in the axis A. The direction indicated by the valley V2, the peak V1 and the peak V3 is a first direction D1 towards a forward direction of the second connector 150.

All of the side walls S1, S2, S3, S4, S5, S6, S7, S8 are not parallel to the axis A and are tilted at an angle with respect to the axis A. In the present embodiment, the tilt directions and the tilt angles of the side walls S1, S2, S3, S4, S5, S6, S7, S8 may not necessarily the same. For example, the side wall S3 is tilted towards the first direction D1, and an angle θ1 is between the side wall S3 and the axis A. The side wall S6 is tilted towards a second direction D2 opposite to the first direction D1, and an angle θ2 is between the side wall S6 and the axis A. The angle θ1 between the side wall S3 and the axis A is not equal to the angle θ2 between the side wall S6 and the axis A. The side wall S7 is tilted towards the first direction D1, and an angle θ3 is between the side wall S7 and the axis A. The angle θ1 between the side wall S3 and the axis A is not equal to the angle θ3 between the side wall S7 and the axis A.

Next, referring to FIG. 3B, the released-segment 320 includes a plurality of side walls S5, S8, S9, S10, S11, wherein the side walls S5, S11 are on the side of the track 300 closer to the accommodation portion 142, and the side walls S8, S9, S10 are on the side of the track 300 farther away from the accommodation portion 142. That is, the side walls S5, S11 and the side walls S8, S9, S10 are respectively on opposite sides of the track 300. It should be noticed that the side walls S5, S8 are used by the locked-segment 310 and the released-segment 320 at the same time, and the side walls S10, S11 are also used by the locked-segment 310 and the released-segment 320 at the same time. A valley V4 is between the side wall S9 and the side wall S10, and the valley V4 points to the first direction D1.

As illustrated in FIG. 3A, the side walls S5, S8, S9, S10, S11 may respectively be tilted at the same angle or different angles with respect to the axis A. For example, the side wall S9 is tilted towards the second direction D2, and an angle θ4 is between the side wall S9 and the axis A. The side wall S10 is tilted towards the first direction D1, and an angle θ5 is between the side wall S10 and the axis A. The angle θ4 between the side wall S9 and the axis A is not equal to the angle θ5 between the side wall S10 and the axis A. The side wall S5 is tilted towards the second direction D2, and an angle θ6 is between the side wall S5 and the axis A. The angle θ6 between the side wall S5 and the axis A is not equal to the angle θ5 between the side wall S10 and the axis A.

FIG. 4A to FIG. 4E are schematic diagram respectively showing the electronic device at each storage stage according to one embodiment of the present invention.

Referring to FIG. 4A to FIG. 4E, the elastic 130 abuts between the accommodation portion 142 and the base 122, and the base 122 is fixed on the bottom end 114 of the housing 110 (the bonding element 116 is not illustrated). In order to facilitate the identification of various elements, the first connector 120 including the base 122, the extended section 124 and the bump 126 is represented by dashed lines, and the remaining elements are represented by solid lines. It is particularly noted here that the dashed lines do not indicate elements that are covered or hidden.

Figure 4A:
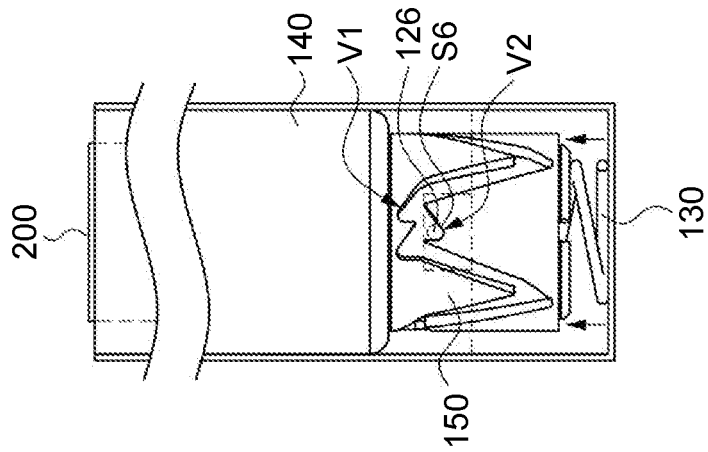
FIG. 4A to FIG. 4E are schematic diagram respectively showing the electronic device at each storage stage according to one embodiment of the present invention.

As shown in FIG. 4A, when the electronic module 200 is placed in the accommodation 100 but has not been pressed down by an applied force, the elastic force of the elastic 130 provides an upward force to the second connector 150 and the acceptor 140. In this way, the valley V4 of the released-segment 320 is engaged with the bump 126 of the first connector 120, so that the second connector 150, the acceptor 140 and the electronic module 200 in the acceptor 140 are positioned at the release position.

Figure 4B:
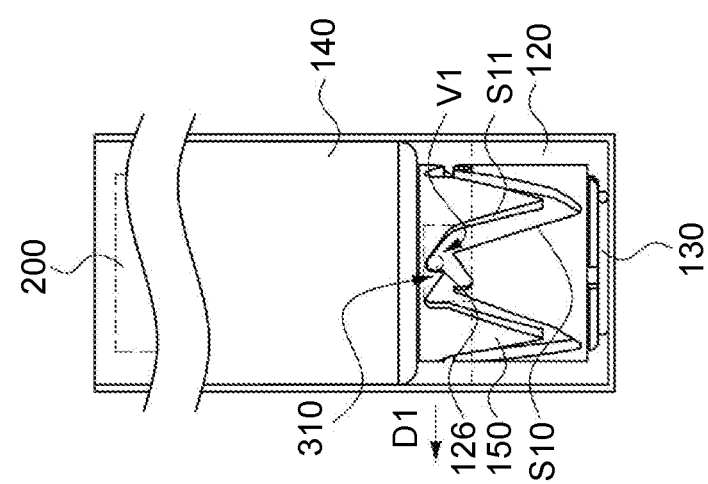

Next, as shown in FIG. 4B, if the user presses down the electronic module 200 with a force, the second connector 150 and the acceptor 140 combined with the second connector 150 are pressed down together and rotate in a forward direction (i.e., the first direction D1) relative to the first connector 120, which is fixed. For example, the bump 126 leads the side walls S10, S11 to slide, so that the second connector 150 and the acceptor 140 sink. At this time, the peak V1 of the locked-segment 310 is temporarily engaged with the bump 126, and the elastic 130 is compressed.

Figure 4C:
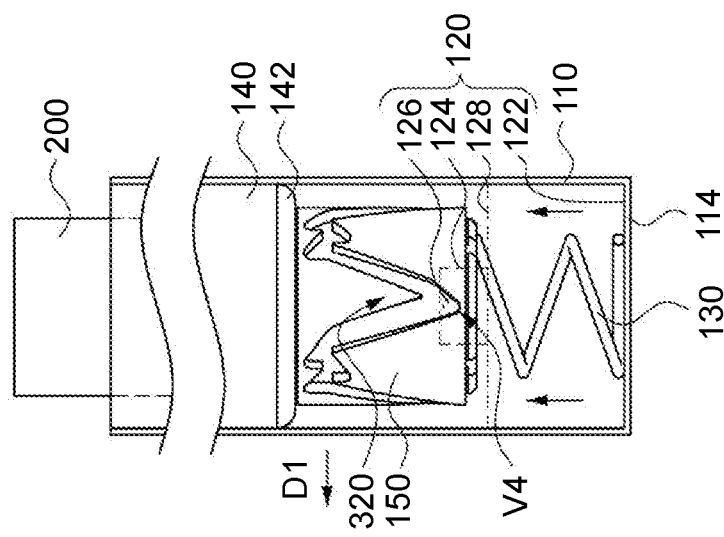

When the user releases his or her hand, as shown in FIG. 4C, the compressed elastic 130 returns to the original state and provides an elastic force to lift the acceptor 140 and the second connector 150. At this time, the peak V1 is detached from the bump 126, and the side wall S6 is in contact with the bump 126 instead, so that the second connector 150 follows the side wall S6 to move. Thus, the valley V2 is engaged with the bump 126, so that the second connector 150, the acceptor 140 and the electronic module 200 in the acceptor 140 are positioned at the lock position.

Figure 4D:
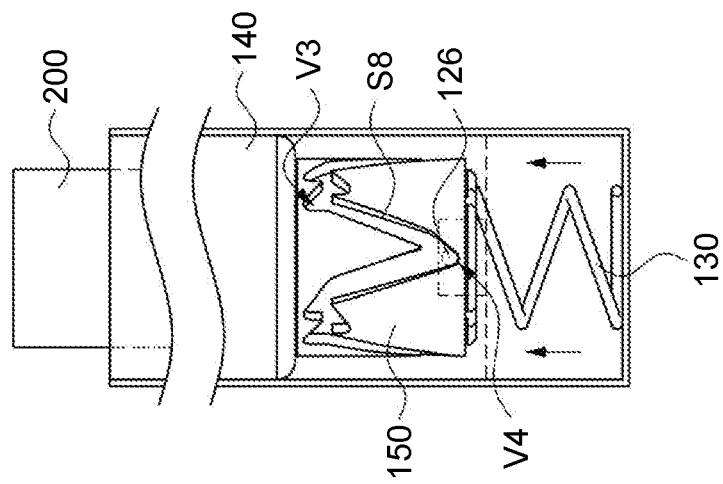

Referring to FIG. 4D, when the user wants to take out the electronic module 200, he or she can press the electronic module 200 again, so that the second connector 150 and the acceptor 140 combined with the second connector 150 are pressed down again and rotate in a forward direction (i.e., the first direction D1) relative to the first connector 120, which is fixed. At this time, the valley V2 is detached from the bump 126, and the side wall S3 is in contact with the bump 126 instead, so that the second connector 150 follows the side wall S3 to move. Thus, the peak V3 is temporarily engaged with the bump 126, and the elastic 130 is compressed.

Figure 4E:
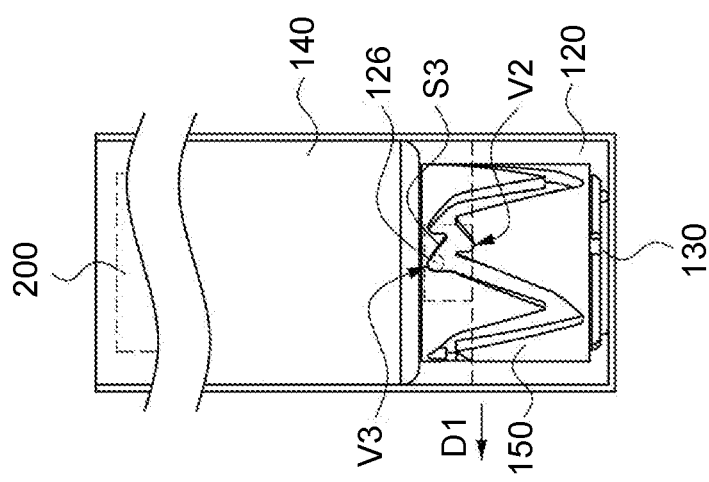

Afterwards, when the user releases his or her hand again, as shown in FIG. 4E, the compressed elastic 130 returns to the original state and provides an elastic force to lift the acceptor 140 and the second connector 150. At this time, the peak V3 is detached from the bump 126, and the side wall S8 is in contact with the bump 126 instead, so that the second connector 150 follows the side wall S8 to move. Thus, the valley V4 is engaged with the bump 126, so that the second connector 150, the acceptor 140 and the electronic module 200 in the acceptor 140 are positioned at the release position.

As mentioned above, the peak V1, the valley V2, the peak V3 and the valley V4 all point to the first direction D1. Therefore, the bump 126 can smoothly enter the peak V1, the valley V2, the peak V3 and the valley V4, and be detached from the peak V1, the valley V2, the peak V3 and the valley V4.

Figure 5:
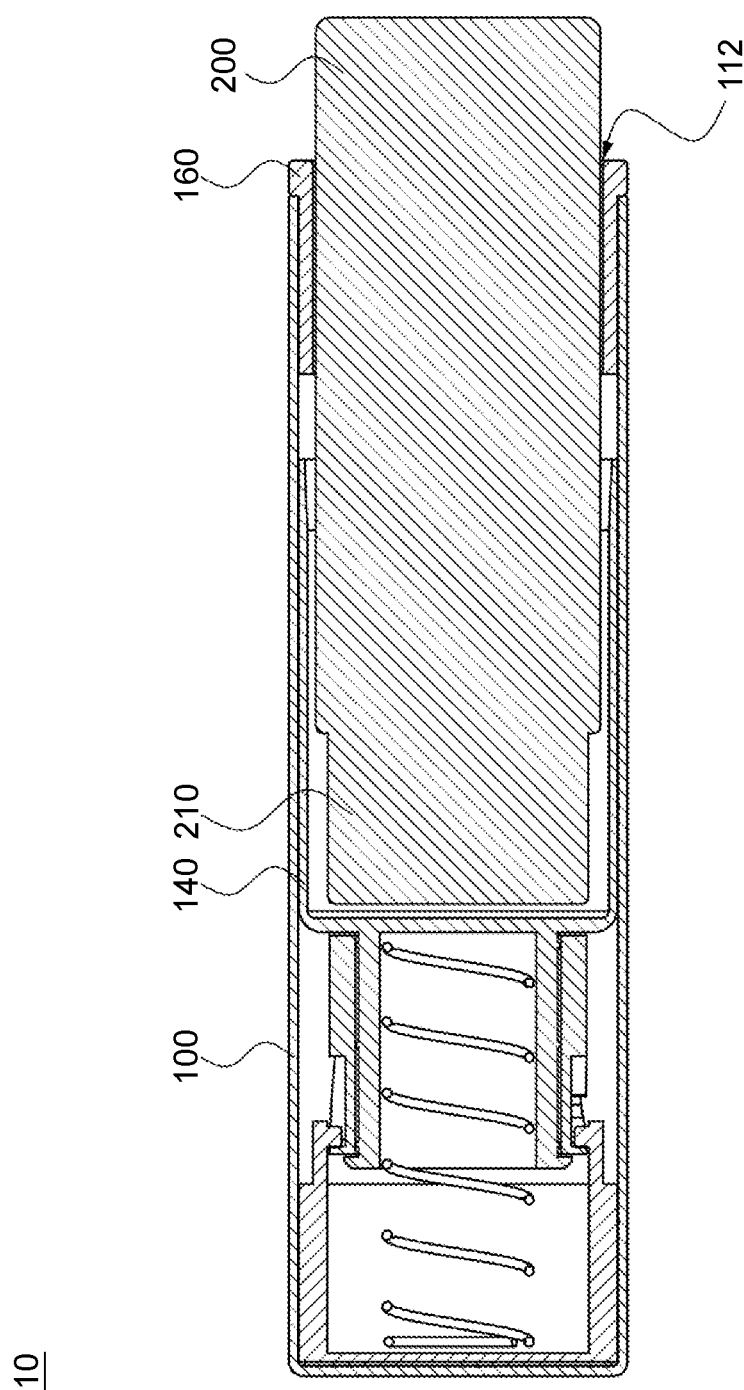
FIG. 5 is a cross-sectional view of the electronic device at a release position according to one embodiment of the present invention.

Referring to FIG. 5, a cross-sectional view of the electronic device at a release position according to one embodiment of the present invention is shown. In one embodiment, the electronic module 200 may be a beauty-related electronic module, such as a skin quality detector. The electronic module 200 includes a detecting head 210. When the electronic module 200 is in the accommodation 100, the detecting head 210 faces the inside of the acceptor 140, so as to protect the detecting head 210 of the electronic module 200 from being impacted by an external force.

The electronic device 10 further includes an anti-slip portion 160. The anti-slip portion 160 is on the opening end 112 of the accommodation 100 to prevent the electronic module 200 from directly falling out of the accommodation 100. In one embodiment, the anti-slip portion 160 may be a material with some compressibility and sufficient friction, such as rubber. The anti-slip portion 160 may be around the opening end 112 of the accommodation 100 annularly or in sections. In other embodiments, other design, such as a combination of depressions and bumps, may be used to prevent the electronic module 200 from directly falling out of the accommodation 100.

The present invention provides an electronic device that is easy to store and take out. With a pre-designed path of the track, the electronic module can be easily stored in the accommodation, and be taken out of the accommodation by a simple pressing action.

Although the present invention has been disclosed as above with the embodiments, it is not intended to limit the present invention. Those skilled in the art can make various modifications and variations without departing from the spirit and scope of the present invention. Therefore, the protection scope of the present invention shall be subject to the scope defined by the claims.

What is claimed is:

1. An electronic device comprising:
    an accommodation having an acceptor, a first connector, a second connector and an elastic, the elastic is between the first connector and the second connector, the second connector is on the acceptor, the first connector and the second connector having at least one bump and a track respectively, the first connector and the second connector are linearly relatively movable with the bump and the track, and the track comprises a plurality of paths, and each of the paths has a plurality of peaks and a plurality of valleys; and
    an electronic module connecting to the acceptor.

2. The electronic device according to claim 1, wherein the accommodation further comprises a housing, and the acceptor, the first connector, the second connector and the elastic is in the housing.

3. The electronic device according to claim 1, wherein each of the paths has a locked-segment, and the locked-segment has a first side extending along a first direction and a second side extending along a second direction.

4. The electronic device according to claim 3, wherein the second connector has an axis, a first angle is between the first direction and the axis, a second angle is between the second direction and the axis, and the first angle and the second angle are unequal.

5. The electronic device according to claim 3, wherein the first side and the second side are on opposite sides of the locked-segment or on the same side of the locked-segment.

6. The electronic device according to claim 1, wherein each of the paths has a released-segment, the released-segment comprises a third side extending along the first direction and a fourth side extending along the second direction, the second connector has an axis, a third angle is between the third side and the axis, a fourth angle is between the fourth side and the axis, and the third angle and the fourth angle are unequal.

7. The electronic device according to claim 6, wherein the third side and the fourth side are on opposite sides of the released-segment.

8. The electronic device according to claim 1, wherein the peaks and the valleys are disposed offset from each other.

9. The electronic device according to claim 1, wherein a number of the at least one bump is even, and a number of the paths is an integer multiple of the number of the bump.

10. The electronic device according to claim 2, further comprising an anti-slip portion which is on an opening end of the housing.

11. An electronic device comprising:
    an electronic module;
    an accommodation having a acceptor, a first connector and a second connector, the acceptor connecting to the electronic module, the first connector and the second connector having at least one bump and a track couple to each other respectively, and the track comprises a plurality of paths, and each of the paths has a plurality of peaks and a plurality of valleys; and
    a lock and release mechanism connecting to the acceptor and positioning the acceptor at a locking position or a release position.

12. The electronic device according to claim 11, wherein each of the paths has a locked-segment, and the locked-segment has a first side extending along a first direction and a second side extending along a second direction.

13. The electronic device according to claim 12, wherein the second connector has an axis, a first angle is between the first direction and the axis, a second angle is between the second direction and the axis, and the first angle and the second angle are unequal.

14. The electronic device according to claim 11, wherein each of the paths has a released-segment, the released-segment comprises a third side extending along the first direction and a fourth side extending along the second direction, the second connector has an axis, a third angle is between the third side and the axis, a fourth angle is between the fourth side and the axis, and the third angle and the fourth angle are unequal.

15. The electronic device according to claim 14, wherein the third side and the fourth side are on opposite sides of the released-segment.

16. The electronic device according to claim 11, wherein the peaks and the valleys are disposed offset from each other.

17. The electronic device according to claim 11, wherein a number of the at least one bump is even, and a number of the paths is an integer multiple of the number of the bump.

18. The electronic device according to claim 11, further comprising an anti-slip portion, wherein the accommodation further comprises a housing, the acceptor, the first connector and the second connector are in the housing, and the anti-slip portion is on an opening end of the housing.

* * * * *